United States Patent
Mori et al.

(10) Patent No.: US 10,184,954 B2
(45) Date of Patent: Jan. 22, 2019

(54) PROBE CARD CASE AND PROBE CARD TRANSFER METHOD

(71) Applicant: Japan Electronic Materials Corp., Hyogo (JP)

(72) Inventors: Chikaomi Mori, Hyogo (JP); Takashi Amemiya, Yamanashi (JP)

(73) Assignee: Japan Electronic Materials Corp., Hyogo (JP)

( * ) Notice: Subject to any disclaimer, the term of this patent is extended or adjusted under 35 U.S.C. 154(b) by 0 days.

(21) Appl. No.: 14/646,344

(22) PCT Filed: Nov. 12, 2013

(86) PCT No.: PCT/JP2013/080968
§ 371 (c)(1),
(2) Date: May 20, 2015

(87) PCT Pub. No.: WO2014/080850
PCT Pub. Date: May 30, 2014

(65) Prior Publication Data
US 2015/0285838 A1  Oct. 8, 2015

(30) Foreign Application Priority Data
Nov. 22, 2012  (JP) .................................. 2012-256209

(51) Int. Cl.
*G01R 1/04* (2006.01)
*G01R 1/073* (2006.01)
*G01R 31/28* (2006.01)

(52) U.S. Cl.
CPC ............. *G01R 1/04* (2013.01); *G01R 1/0408* (2013.01); *G01R 1/07314* (2013.01); *G01R 31/2893* (2013.01)

(58) Field of Classification Search
None
See application file for complete search history.

(56) References Cited

U.S. PATENT DOCUMENTS

| 4,978,914 | A | * | 12/1990 | Akimoto | .................. G01R 1/04 |
| | | | | | 219/209 |
| 5,309,327 | A | * | 5/1994 | Slater | .................. H05K 1/0287 |
| | | | | | 174/250 |

(Continued)

FOREIGN PATENT DOCUMENTS

| JP | 07-169800 A | 7/1995 |
| JP | 2003-100821 A | 4/2003 |

(Continued)

OTHER PUBLICATIONS

International Search Report dated Jan. 7, 2014 for WO 2014/080850 A1.

*Primary Examiner* — Paresh H Patel
(74) *Attorney, Agent, or Firm* — Abelman, Frayne & Schwab

(57) ABSTRACT

Disclosed is a probe card case for accommodating a probe card. The probe card case includes: a first case member configured to mount the probe card at a predetermined position therein; a second case member configured to be fitted to a top side of the first case member, and including a card fixing mechanism for fixing the probe card; and a case fixing mechanism configured to fix the first case member and the second case member. The probe card is capable of being transferred in a state where the probe card is accommodated in the probe card case and the first case member and the second case member are fixed, and the probe card is capable of being transferred only with the second case member in a state where the probe card is fixed to the second case member.

6 Claims, 13 Drawing Sheets

(56) References Cited

U.S. PATENT DOCUMENTS

| | | | |
|---|---|---|---|
| 5,695,068 A | 12/1997 | Hart et al. | |
| 6,170,329 B1 * | 1/2001 | Steketee | G01R 1/04 73/431 |
| 6,305,076 B1 * | 10/2001 | Bright | H05K 13/0482 29/739 |
| 7,082,676 B2 * | 8/2006 | Ramirez | H01R 13/6485 29/705 |
| 2009/0289050 A1 * | 11/2009 | Ondricek | G01R 31/2863 219/386 |
| 2013/0056390 A1 | 3/2013 | Saito | |

FOREIGN PATENT DOCUMENTS

| | | | | |
|---|---|---|---|---|
| JP | 2010-080775 A | | 4/2010 | |
| JP | 3171687 U | * | 11/2011 | H01L 21/67353 |

\* cited by examiner

PROBE CARD CASE AND PROBE CARD TRANSFER METHOD

CROSS REFERENCE TO RELATED APPLICATIONS

This application is a national phase of PCT application No. PCT/JP2013/080968, filed on 12 Nov. 2013, which claims priority from Japanese patent application No. 2012-256209, filed on 22 Nov. 2012, all of which are incorporated herein by reference.

TECHNICAL FIELD

The present invention relates to a probe card case and a probe card transfer method.

BACKGROUND

In a semiconductor device manufacturing process, a probe device is used for performing an electrical inspection of semiconductor devices formed on a semiconductor wafer. Such a probe device uses a probe card including a plurality of probes arranged to come into contact with electrode pads on the semiconductor wafer (see, e.g., Patent Document 1).

As for the probe card described above, a probe card configured to bring the probes into contact with the plurality of semiconductor devices formed on the semiconductor wafer in batches has been developed, and hence efficiency in inspecting the semiconductor devices has been improved. Occasionally, such a probe card is transferred by a worker holding it in hands in a state where the probe card is removed from the probe device.

The probe card configured to bring the probes into contact with the semiconductor devices in batches tends to increase in size and also become heavy in weight. In addition, when the probe card is held in hands, it is necessary to prevent the hands from coming into contact with the probes. For this reason, for example, a structural member is disposed so that a somewhat large region is secured outside a probe arrangement area, or a handle for holding the probe card is provided.

However, in the aforementioned configurations, the probe card is further enlarged in diameter (size), the weight is also increased, and the manufacturing costs is also increased. Meanwhile, when the probe card is reduced in diameter (size) so as to avoid the problems, it becomes difficult to handle the probe card.

In addition, accommodating a probe card in a case to protect, for example, probes is also known (see, e.g., Patent Document 2 and Patent Document 3).

PRIOR ART DOCUMENT

Patent Document

Patent Document 1: Japanese Patent Laid-Open Publication No. 2010-080775
Patent Document 2: Japanese Patent Laid-Open Publication No. H07-169800
Patent Document 3: Japanese Patent Laid-Open Publication No. 2003-100821

SUMMARY OF THE INVENTION

Problems to be Solved

As described above, in the related art, there are problems caused by a large diameter (size) of the probe card, and there is a problem in that it is difficult to reduce a diameter (size) of the probe card in view of ease of handling.

The present invention has been made in consideration of the situation in the related art, and an object of the present invention is to provide a probe card case and a probe card transfer method which may easily handle a probe card, and may also be applied to a probe card having a small diameter (size).

Means to Solve the Problems

According to the present invention, there is provided a probe card case for accommodating a probe card. The probe card case including: a first case member configured to mount the probe card at a predetermined position therein; a second case member configured to be fitted to a top side of the first case member, in which the second case member includes a card fixing mechanism for fixing the probe card; and a case fixing mechanism configured to fix the first case member and the second case member. The probe card is capable of being transferred in a state where the probe card is accommodated in the probe card case and the first case member and the second case member are fixed, and the probe card is capable of being transferred only with the second case member in a state where the probe card is fixed to the second case member.

In the present invention, the probe card is capable of being fixed by the card fixing mechanism from the outside of the second case member, and the fixed probe card is capable of being released from the second case member.

In the present invention, at least a part of the second case member is transparent so that the probe card accommodated in the probe card case is visible from the outside.

In the present invention, a plurality of transfer handles is provided on the second case member.

In the present invention, fitting portions are disposed on an top surface of the second case member and a bottom surface of the first case member, respectively, in which the fitting portions are fitted to each other when a plurality of probe card cases is superimposed.

According to the present invention, there is provided a method of transfer a probe card which includes an insulating substrate, a probe disposed on a bottom surface of the substrate, an electrical connecting portion disposed on a top surface of the substrate and connected to an electrical measuring device when electrically connected with the probe, and a frame configured to surround the substrate. The probe card transfer method including: causing the probe card to be accommodated in the probe card case according to claim 1; and transferring the probe card only with the second case member in a state where the probe card is fixed to the second case member.

Advantageous Effects of Invention

According to the present invention, it is possible to easily handle the probe card, and it is possible to be applied to the probe card having a small diameter (size).

DETAILED DESCRIPTION TO EXECUTE THE INVENTION

Hereinafter, an exemplary embodiment of the present invention will be described with reference to the drawings.

Figure 1:
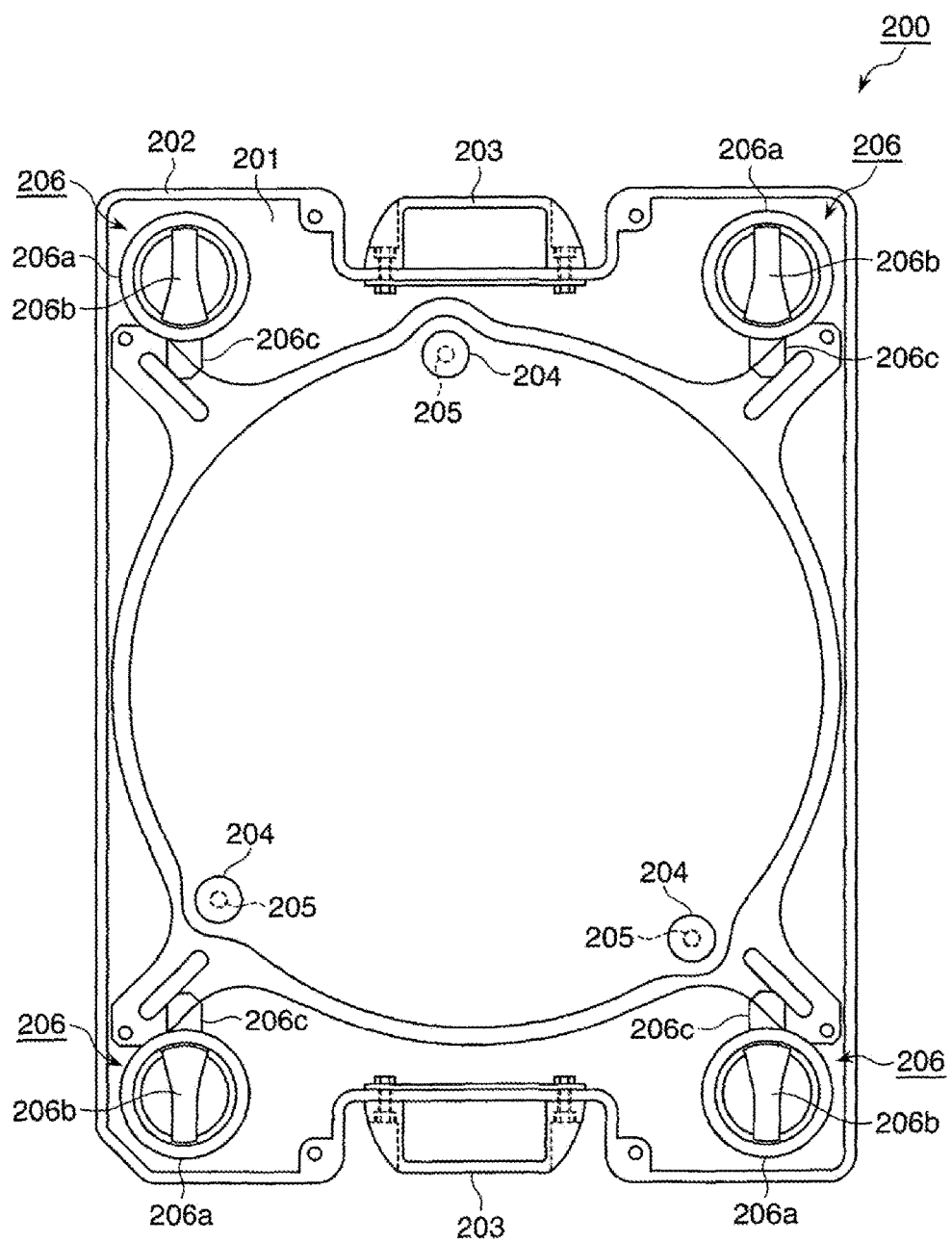
FIG. 1 is a plan view of an upper case of a probe card case according to an exemplary embodiment of the present invention.
Figure 2:
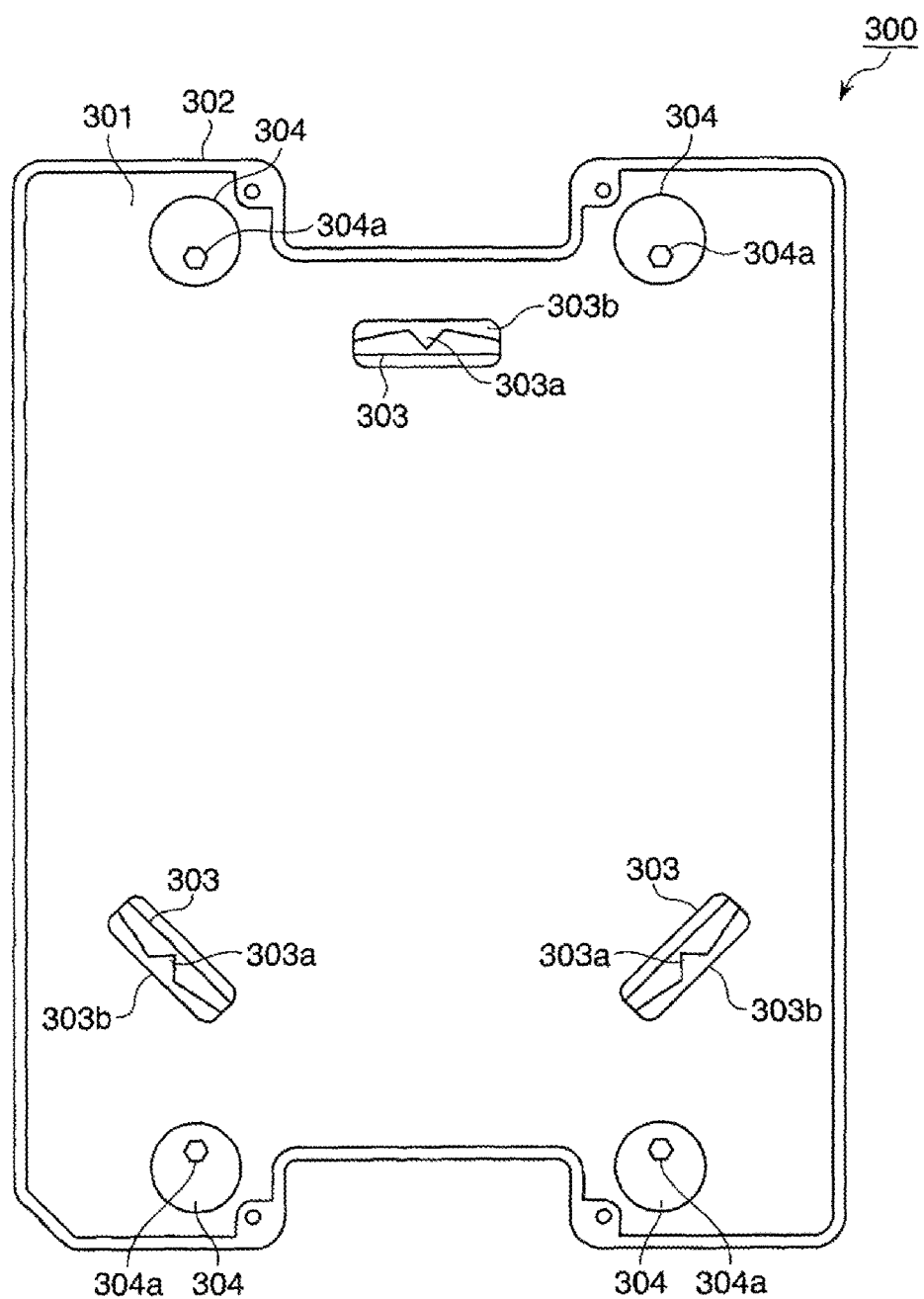
FIG. 2 is a plan view of a lower case of the probe card case according to the present exemplary embodiment.

FIG. 1 is a plan view of an upper case (a second case member) 200 that constitutes a probe card case 100 (see FIG. 5) according to an exemplary embodiment of the present invention, and FIG. 2 is a plan view illustrating a configuration of a lower case (a first case member) 300 that constitutes the probe card case 100.

In the present exemplary embodiment, at least a part or the entirety of the upper case 200 is made of a transparent resin, and has a substantially rectangular shape. The upper case 200 has a plate-shaped top plate 201, and side walls 202 which extend downward from circumferential edges of the top plate 201. In addition, in the upper case 200, handles 203 are disposed on the opposite side walls 202 (upper and lower side walls in FIG. 1) such that the upper case 200 and the probe card case 100, in which the upper case 200 and the lower case 300 are combined, may be transferred by holding the handles 203.

In addition, a plurality of handle screws 204 (three handle screws 204 in an example illustrated in FIG. 1) are disposed on the upper case 200 as a card fixing mechanism for fixing a probe card 400 (described below) to the upper case 200. The handle screws 204 are inserted into through holes 205 disposed in the upper case 200. In addition, as illustrated in FIG. 6B to be described below, a handle portion 204a for rotating the handle screws 204 is disposed to be positioned outside the upper case 200, and a male screw 204b to be screw-coupled with the probe card 400 is disposed to be positioned inside the upper case 200.

In addition, upper fixing mechanisms 206, which constitute a case fixing mechanism for fixing the upper case 200 and the lower case 300, are disposed at four corners of the upper case 200, respectively. Each upper fixing mechanism 206 includes a bottom-closed cylindrical frame portion 206a arranged outside the upper case 200 and protruding in a ring shape from the top surface of the upper case 200, a knob 206b rotatably arranged in the frame portion 206a, and a plate-shaped coupling portion 206c connected to the knob 206b and arranged in the upper case 200. Further, the coupling portion 206c is rotated by rotating the knob 206b, and coupled to a lower fixing mechanism 304 of the lower case 300 (described below with reference to FIG. 2), thereby fixing the upper case 200 and the lower case 300. In addition, since the upper case 200 is made of a transparent resin, the probe card 400 fixed to the upper case 200 is visible from the outside.

As illustrated in FIG. 2, the lower case 300 is made of, for example, a resin, and has a substantially rectangular shape. The lower case 300 has a plate-shaped bottom plate 301, and side walls 302 extending upward from circumferential edges of the bottom plate 301. Further, the lower case 300 is fitted to the upper case 200 to constitute the probe card case 100 with a container shape. A plurality of (in the present exemplary embodiment, three) mounting portions 303 is arranged at predetermined positions spaced apart from each other on the bottom plate 301 of the lower case 300, so as to mount and align a probe card 400 (see FIG. 5) at a predetermined position.

A positioning portion 303b is arranged at an outer circumferential side of each mounting portion 303, in which the positioning portion 303b has a protrusion 303a that protrudes upward from a mounting surface of the probe card 400 and protrudes toward an inner circumferential side. The positioning portion 303b abuts an outer circumferential portion of a positioning portion 404 (see FIG. 5) of the probe card 400, which will be described below, and the protrusion 303a is fitted to a notch 404a for positioning the probe card 400.

In addition, the four lower fixing mechanisms 304, which constitute a case fixing mechanism, are disposed on the bottom plate 301 of the lower case 300 to correspond to the upper fixing mechanisms 206 of the upper case 200. Ball plungers 304a are arranged in the lower fixing mechanisms 304, respectively. As illustrated in FIG. 6B, each lower fixing mechanism 304 is configured to have a slit 304b in a middle portion in a vertical direction, in which the ball plunger 304a is fixed in a state where a tip end of a ball plunger 304a protrudes into the slit 304b. Further, as described above, the coupling portions 206c of the upper fixing mechanisms 206 disposed on the upper case 200 are inserted into the slits 304b of the lower fixing mechanism 304 while being rotated, and fixed by being coupled to the ball plungers 304a.

Figure 3:
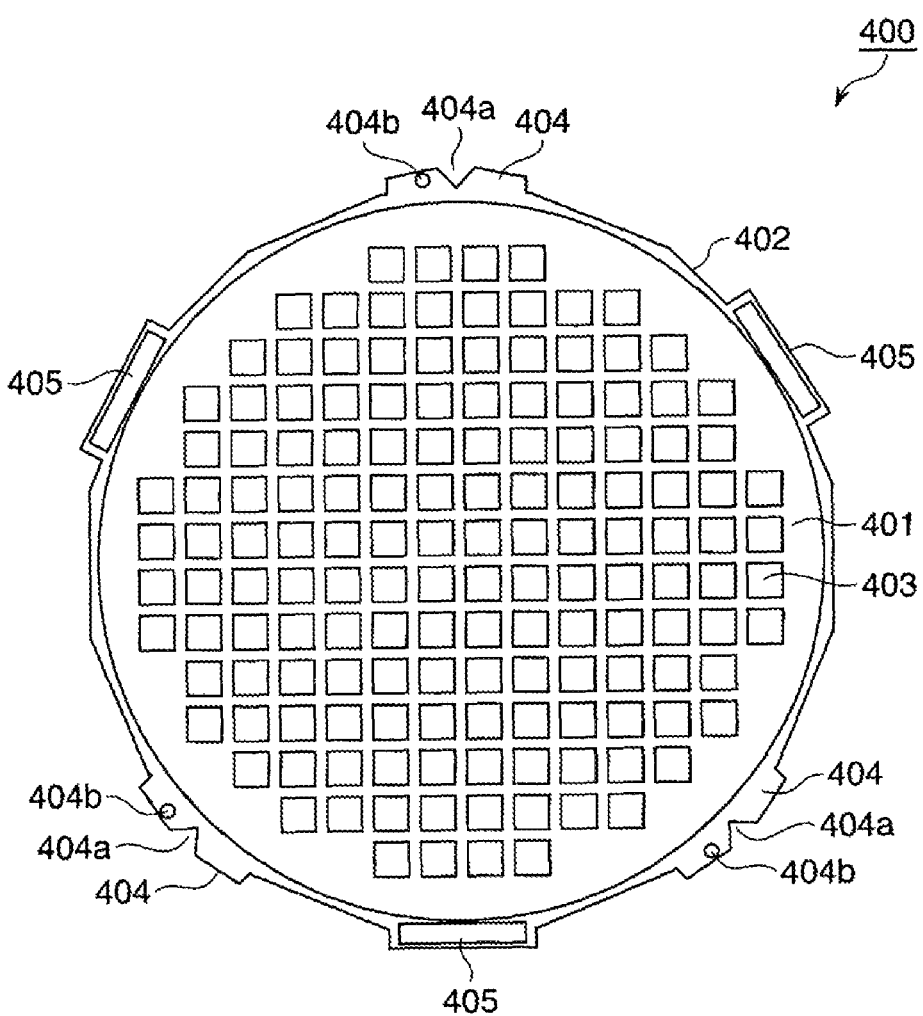
FIG. 3 is a plan view of the probe card.

FIG. 3 is a plan view of the probe card 400 when viewed from the top side. As illustrated in FIG. 3, the probe card 400 has an insulating substrate 401, and a ring-shaped frame 402 disposed to surround the substrate 401. The substrate 401 may be made of, for example, ceramic, and the frame 402 may be made of, for example, metal.

A plurality of electrical connecting portions (not illustrated) to be electrically connected to electrical measuring devices such as, for example, a tester, is disposed on the top surface of the substrate 401. Each of a plurality of quadrangles illustrated in FIG. 3 indicates a subset 403 of a plurality of electrical connecting portions associated with a single semiconductor chip, and in practice, the plurality of electrical connecting portions is disposed within the quadrangular region. A plurality of probes (not illustrated) electrically connected with the electrical connecting portions is disposed on the bottom surface of the substrate 401 to correspond to the electrical connecting portions. For example, pogo pins come into contact with the electrical connecting portions to obtain electrical conduction.

In the present exemplary embodiment, in order to miniaturize the entire probe card 400, the frame 402 is disposed to slightly extend to the outer circumference of the substrate 401, for example, by about 5 mm to 20 mm. In addition, the plurality of (in the present exemplary embodiment, three)

positioning portions 404 is arranged on the frame 402 at predetermined intervals in the circumferential direction so as to align and fix the probe card 400 to a predetermined position. The positioning portions 404 are disposed to protrude toward the outer circumference from the frame 402, and include notches 404a for positioning the probe card 400, and screw holes 404b screw-coupled with the aforementioned male screws 204b of the handle screws 204 of the upper case 200, respectively. In addition, similar to the positioning portions 404, a plurality of (three in the present exemplary embodiment) protrusions 405 is disposed at intervals in the circumferential direction to protrude toward the outer circumference from the frame 402. For example, labels indicated with, e.g. an ID, are attached to the protrusions 405.

Figure 4:
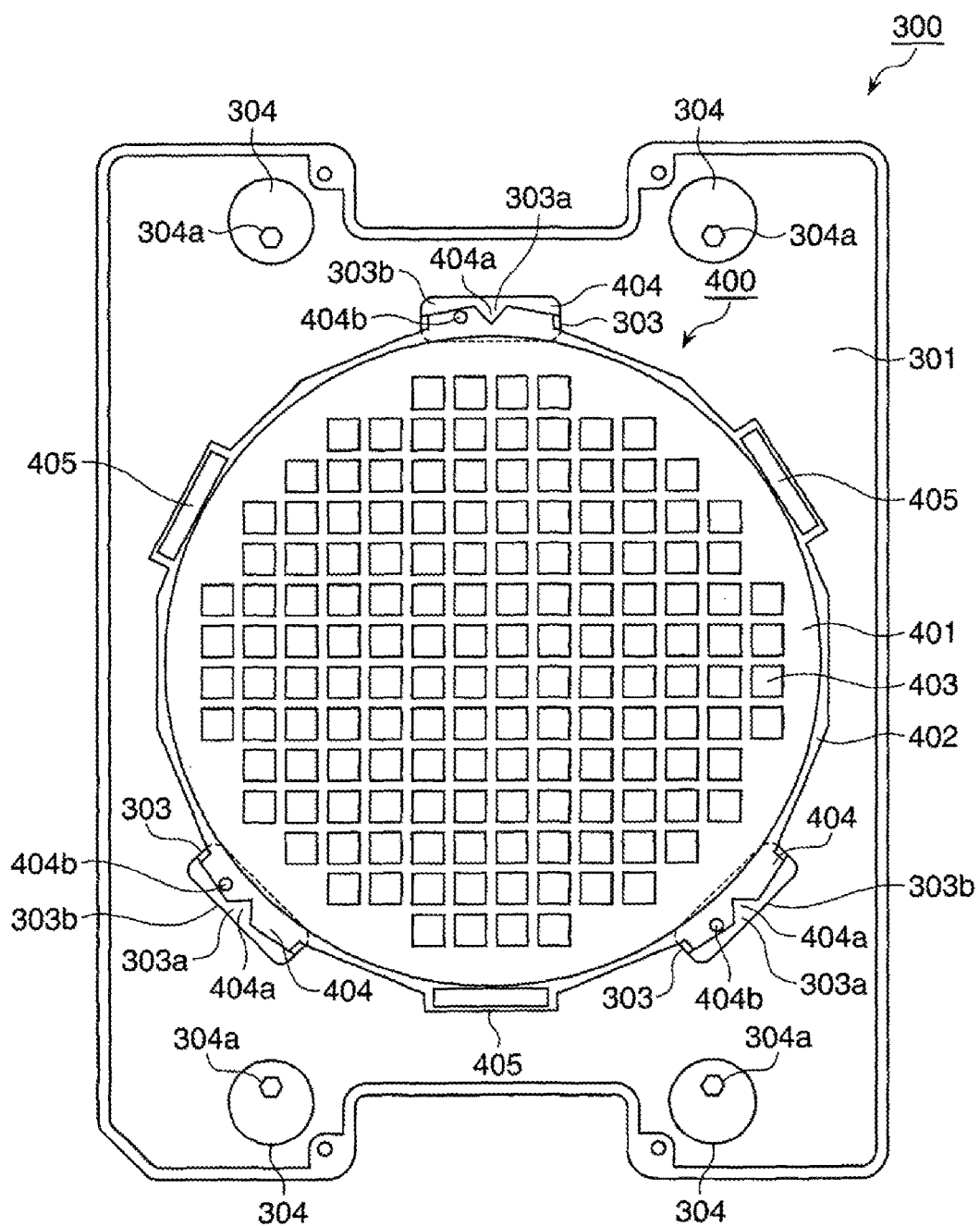
FIG. 4 is a plan view illustrating a state in which the probe card is mounted on the lower case.

FIG. 4 illustrates a state in which the probe card 400 is mounted on the mounting portions 303 of the lower case 300. In this state, the probe card 400 is mounted in a state in which the probe card 400 is aligned at a predetermined position on the lower case 300, by the positioning portions 404 and the notches 404a of the probe card 400, and the positioning portions 303b and the protrusions 303a of the mounting portions 303. In addition, the plurality of probes is arranged on the bottom side of the probe card 400, as described above. For this reason, the mounting portions 303 have a height that makes the probes of the probe card 400 not come into contact with the bottom plate 301 of the lower case 300 when the probe card 400 is mounted.

Figure 5:
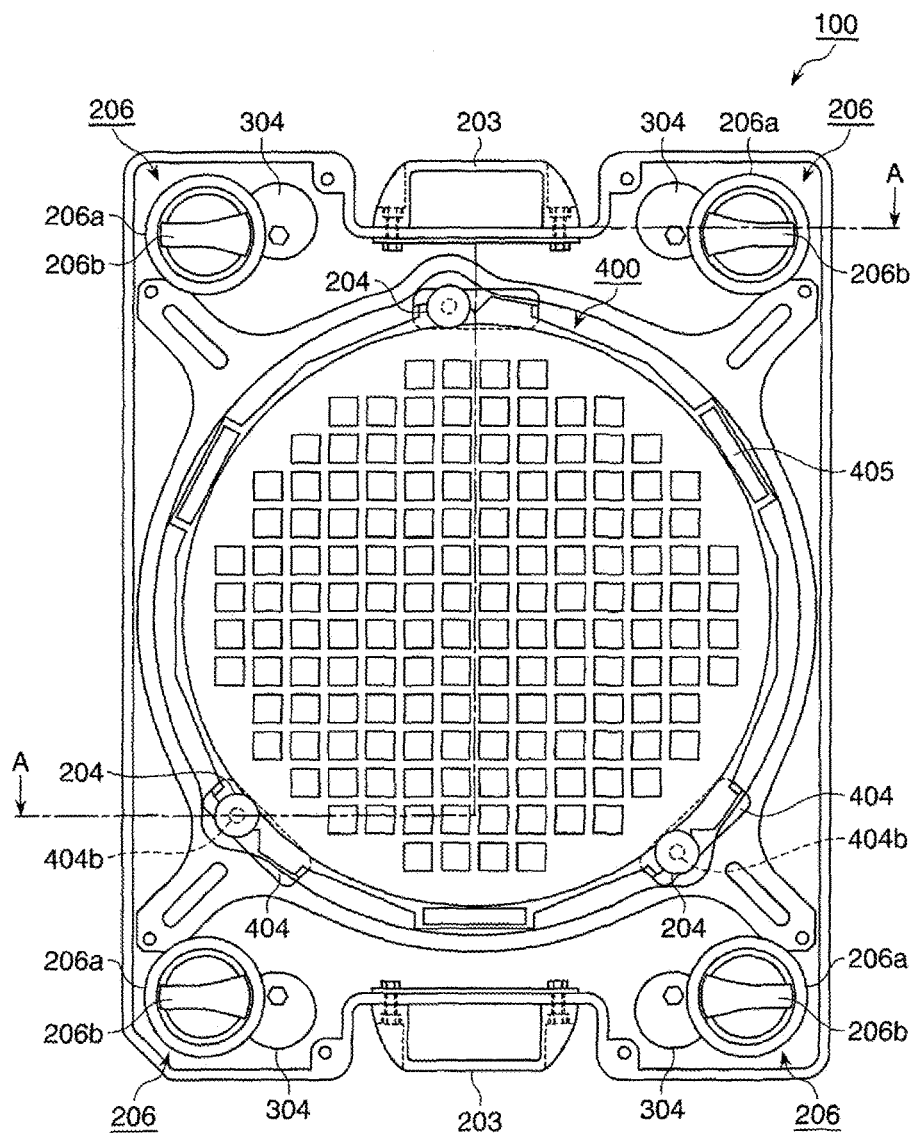
FIG. 5 is a plan view illustrating a state in which the probe card is accommodated in the probe card case.

FIG. 5 illustrates a state in which the lower case 300 is covered by the upper case 200 from the state illustrated in FIG. 4. The handle screws 204 are in the upper case 200 to correspond to the positions of the screw holes 404b provided in the positioning portions 404 of the probe card 400. When the handle portions 204a (see FIG. 6B) of the handle screws 204 are rotated, the male screws 204b (see FIG. 6B) of the handle screws 204 screw-coupled to the screw holes 404b, respectively. Accordingly, the probe card 400 is fixed to the upper case 200 within the probe card case 100.

Further, when the knobs 206b of the upper fixing mechanisms 206 disposed at the four corners of the upper case 200 are rotated, the coupling portions 206c (see FIG. 1) are rotated and coupled to the lower fixing mechanisms 304 of the lower case 300, such that the upper case 200 and the lower case 300 are fixed to each other. Accordingly, the probe card 400 is accommodated in the probe card case 100, and fixed to the probe card case 100 so that the probe card 400 can be safely transferred and stored.

Figure 6A:
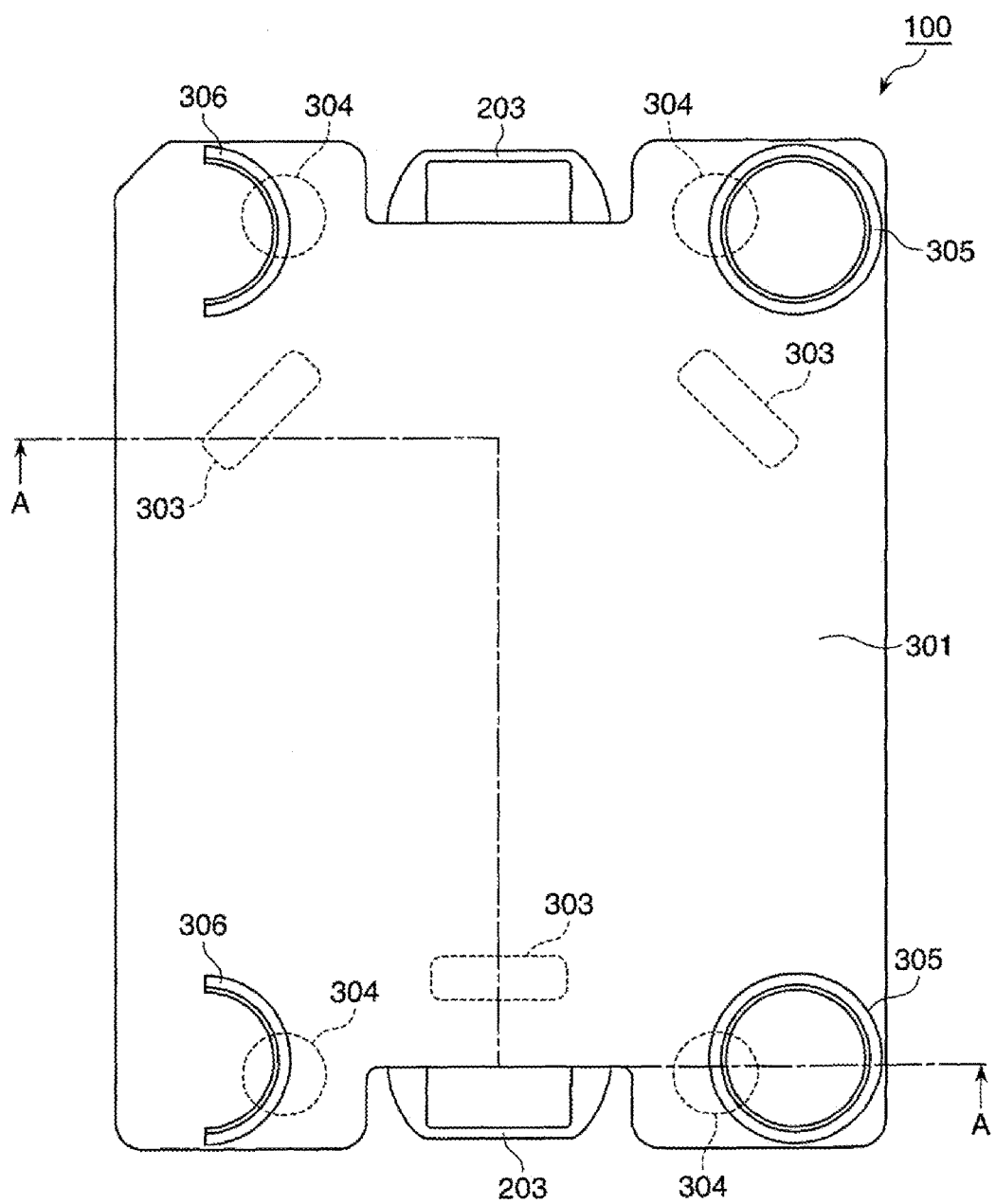
FIG. 6A is a bottom view of the probe card case in FIG. 5.
Figure 6B:
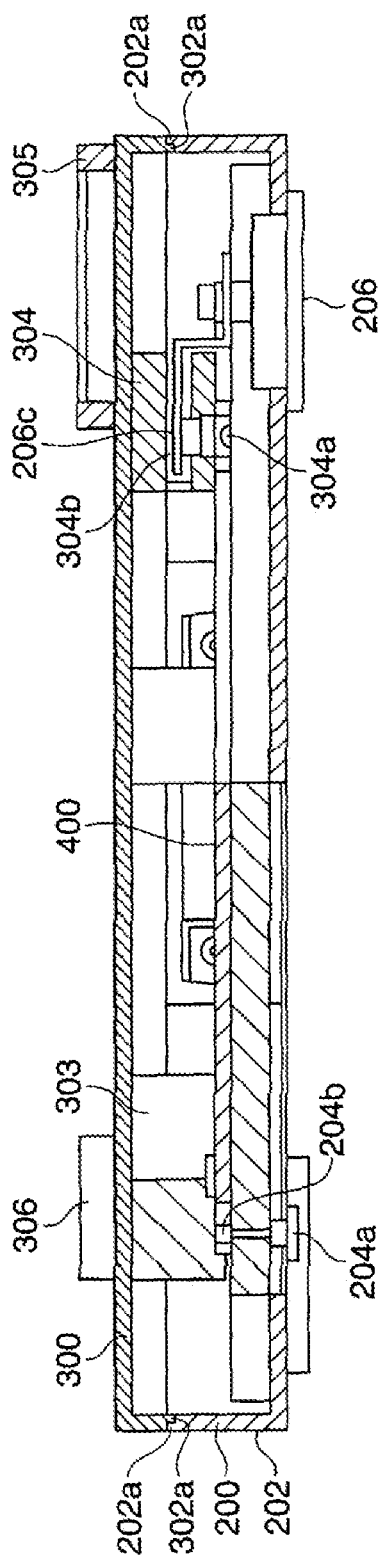
FIG. 6B is a cross-sectional view taken along line A-A in FIGS. 5 and 6A.

FIGS. 6A and 6B illustrate a state in which the probe card case 100 is configured by combining the upper case 200 and the lower case 300, in which FIG. 6A illustrates a bottom configuration of the probe card case 100, and FIG. 6B illustrates a cross-sectional configuration taken along line A-A of FIGS. 5 and 6A. As illustrated in FIG. 6A, two ring-shaped protrusions 305 protruding in the form of a ring and two half ring-shaped protrusions 306 protruding in the form of a half ring are formed outside the bottom plate 301 of the lower case 300. When probe card cases 100 are superimposed, the ring-shaped protrusions 305 and the half ring-shaped protrusions 306 are fitted to the outer circumferential portions of the frame portions 206a of the upper fixing mechanism 206 arranged on the upper case 200 such that when the plurality of probe card cases 100 is superimposed, the probe card cases 100 can be stably maintained.

As illustrated in FIG. 6B, an upper stepped portion 202a, in which an outer side more protrudes than an inner side, is formed on the tip end of each side wall 202 of the upper case 200, and a lower stepped portion 302a, in which an inner side more protrudes than an outer side, is formed on the tip end of each side wall 302 of the lower case 300. Further, the upper case 200 and the lower case 300 are combined in a state in which the upper stepped portions 202a and the lower stepped portions 302a are fitted to each other.

Accordingly, when the probe card 400 accommodated in the probe card case 100 is taken out of the probe card case 100 and mounted on, for example, a wafer inspection apparatus to be used, the upper case 200 and the lower case 300 are separated by rotating the knobs 206b of the upper fixing mechanisms 206 disposed at the four corners of the upper case 200. In this case, the probe card 400 is fixed to the upper case 200 as it is. Accordingly, the probe card 400 may be transferred together with the upper case 200 by holding the handle 203 of the upper case 200.

Figure 7:
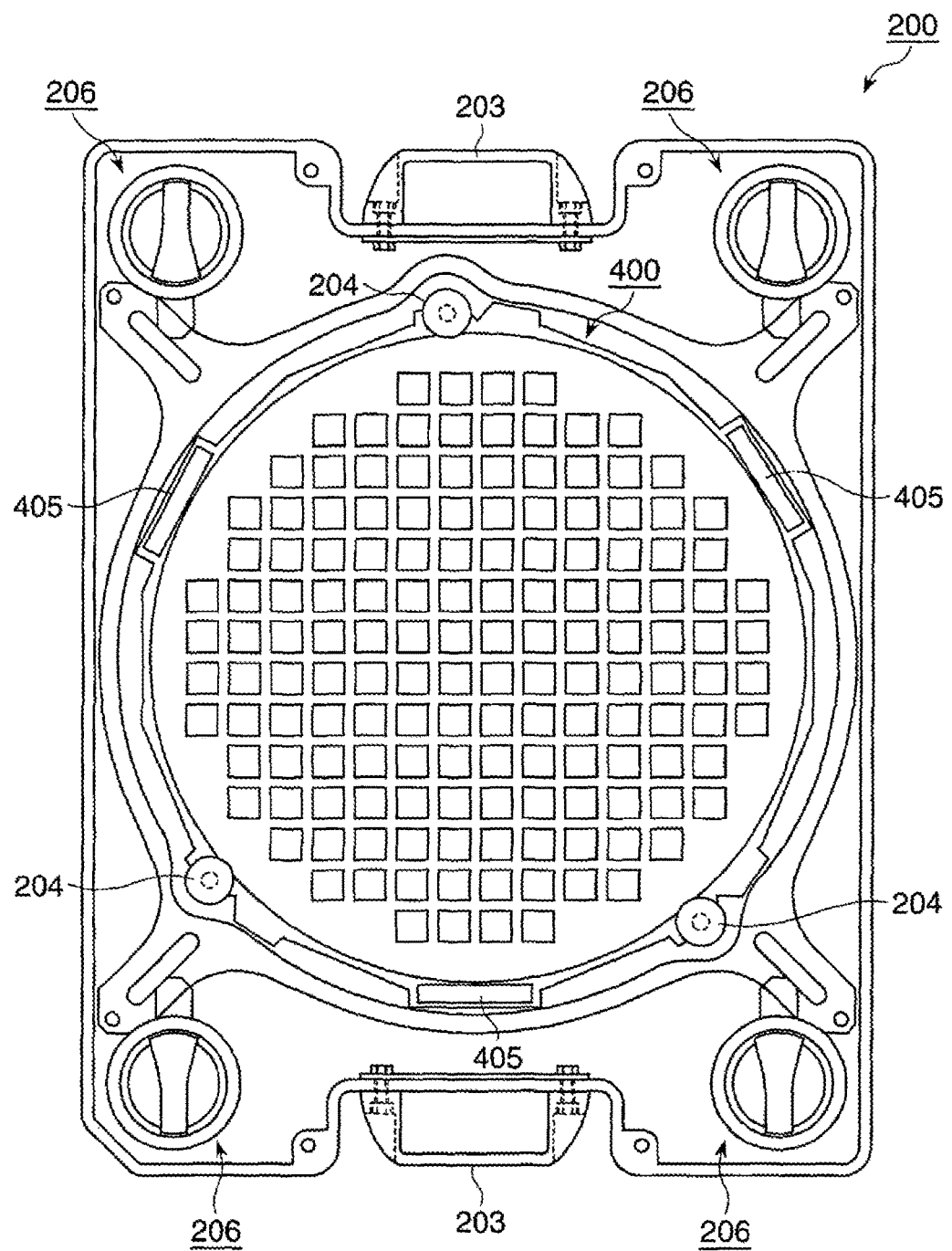
FIG. 7 is a plan view illustrating a state in which the probe card is fixed to the upper case.

FIG. 7 illustrates a state in which the upper case 200 and the lower case 300 are separated and the probe card 400 is fixed to the upper case 200. In the state illustrated in FIG. 7, the probe card 400 is covered by the upper case 200 to be protected by the upper case 200. Thus, it is possible to prevent the occurrence of problems such as contamination of the probes or damage to the probes which may be caused when a hand comes into contact with the probes of the probe card 400.

Figure 8:
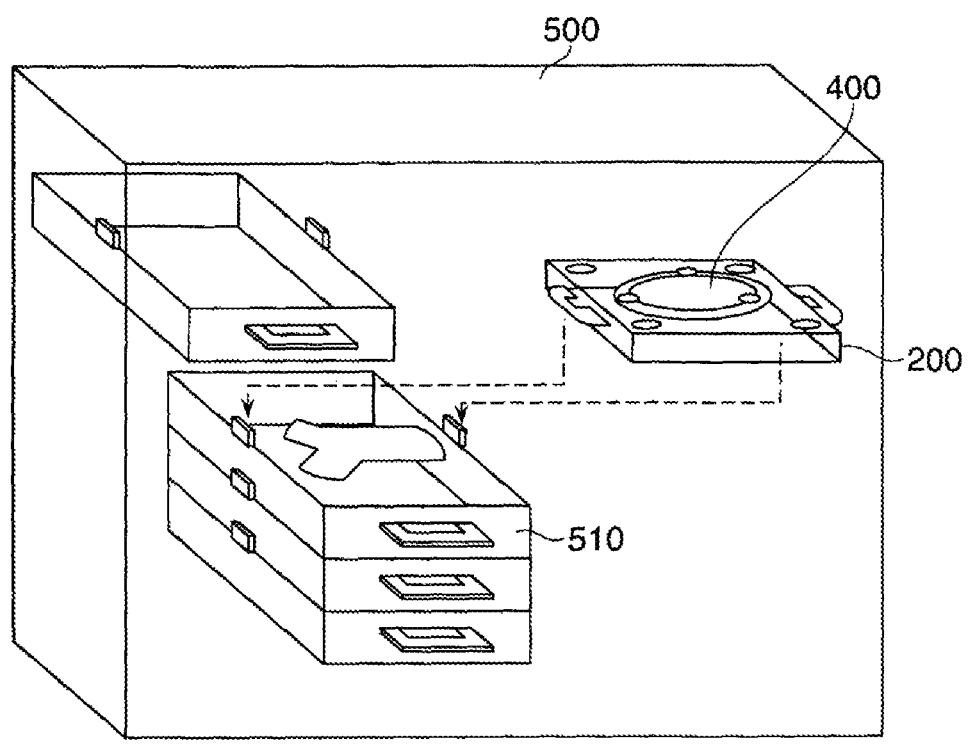
FIG. 8 is a view for explaining a process of transferring the probe card.

Further, for example, as illustrated in FIG. 8, the probe card 400 is transferred to a desired position, for example, to a probe card accommodating unit 510 of a wafer inspection apparatus 500 in a state where probe card 400 is fixed to and covered by the upper case 200.

Figure 9:
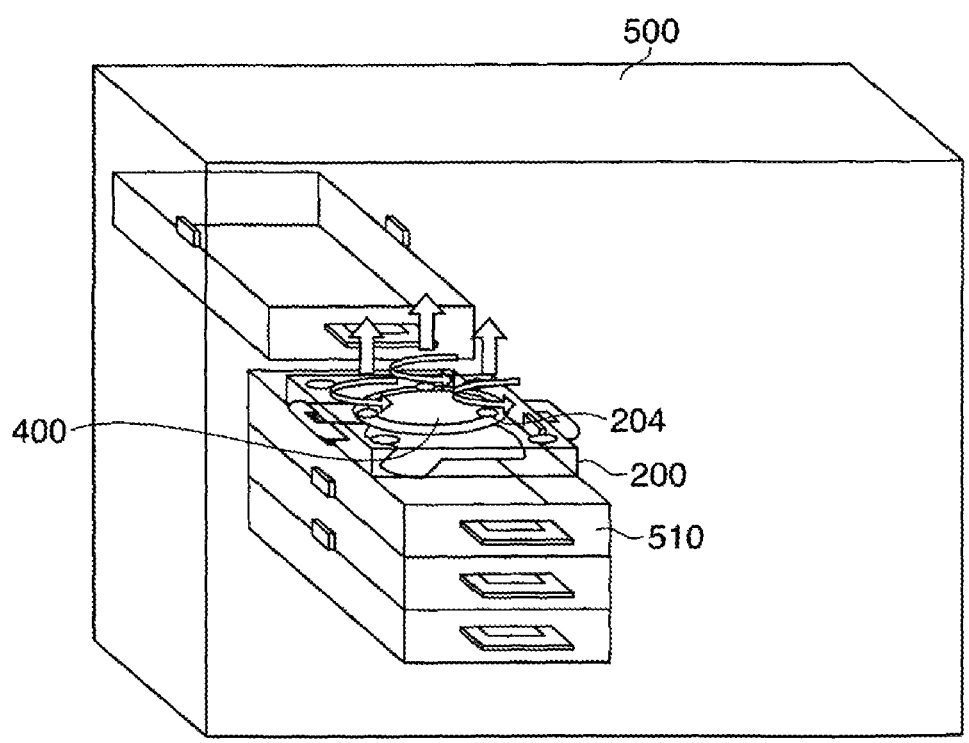
FIG. 9 is a view for explaining a process of transferring the probe card.

Next, as illustrated in FIG. 9, in a state where the probe card 400 is aligned in the probe card accommodating unit 510 by the positioning portions 404 (not illustrated in FIG. 9) of the probe card 400, the probe card 400 is mounted on a predetermined region and the handle screw 204 is rotated, so that the probe card 400 is released from the upper case 200.

Figure 10:
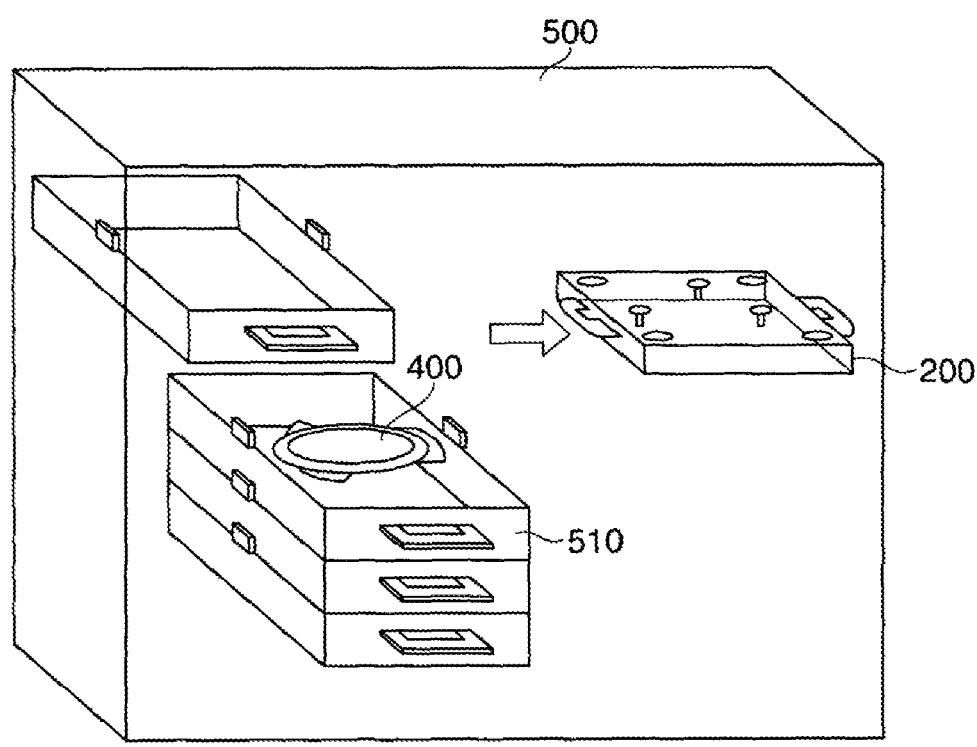
FIG. 10 is a view for explaining a process of transferring the probe card.

Further, as illustrated in FIG. 10, after the probe card 400 is released from the upper case 200, only the upper case 200 is transferred and then the upper case 200 is stored in a predetermined place together with the lower case 300.

As described above, in the present exemplary embodiment, the probe card 400 may be safely transferred without providing, for example, a handle to be hold in hand for transferring the probe card 400, to the probe card 400. Therefore, like the probe card 400 illustrated in FIG. 3, it is possible to simplify a structure of the probe card, and to reduce a diameter (size) of the probe card. Accordingly, it is possible to reduce manufacturing costs of the probe card, and to make the probe card light in weight.

Figure 11:
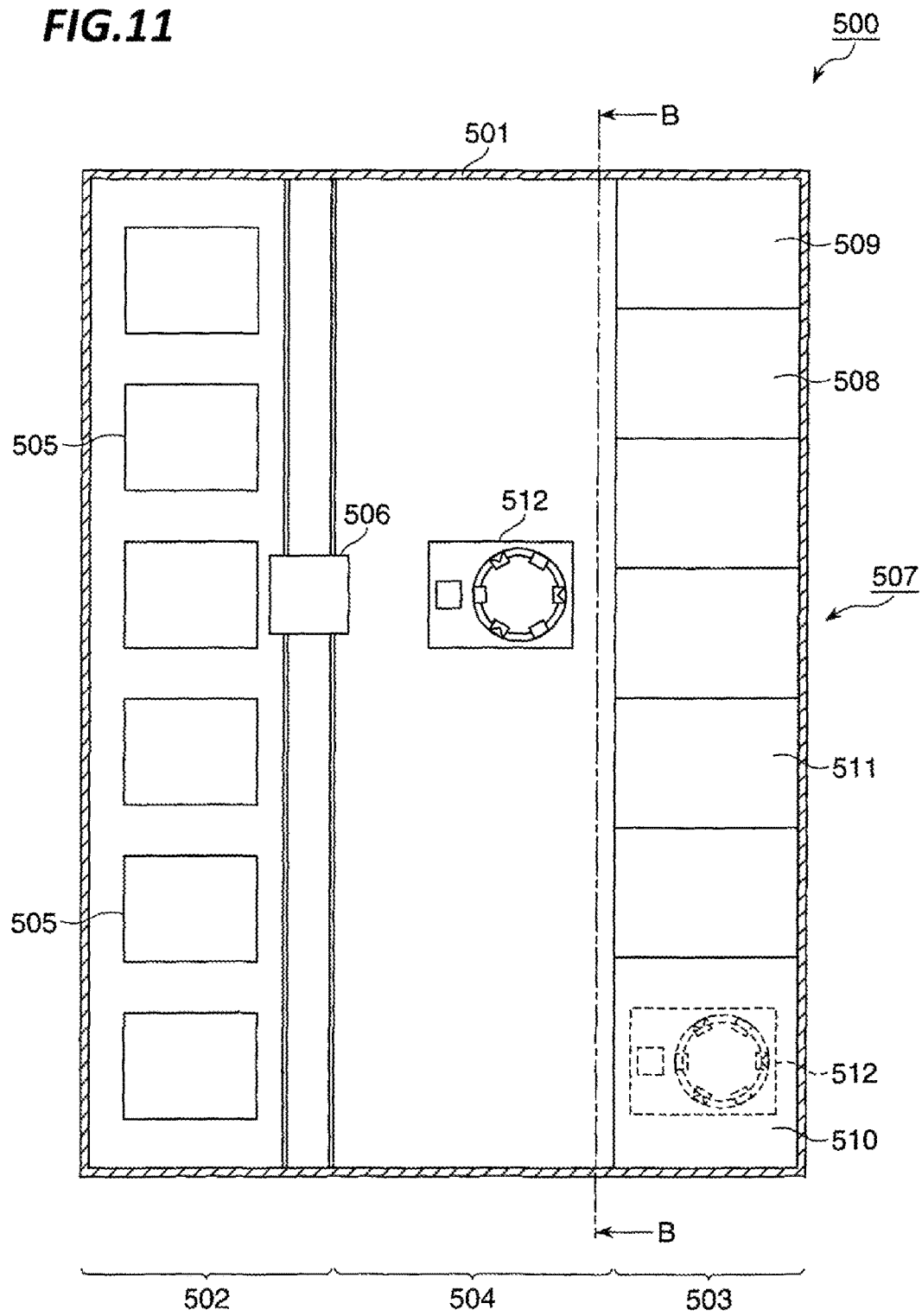
FIG. 11 is a view illustrating a schematic configuration of a wafer inspection apparatus.
Figure 12:
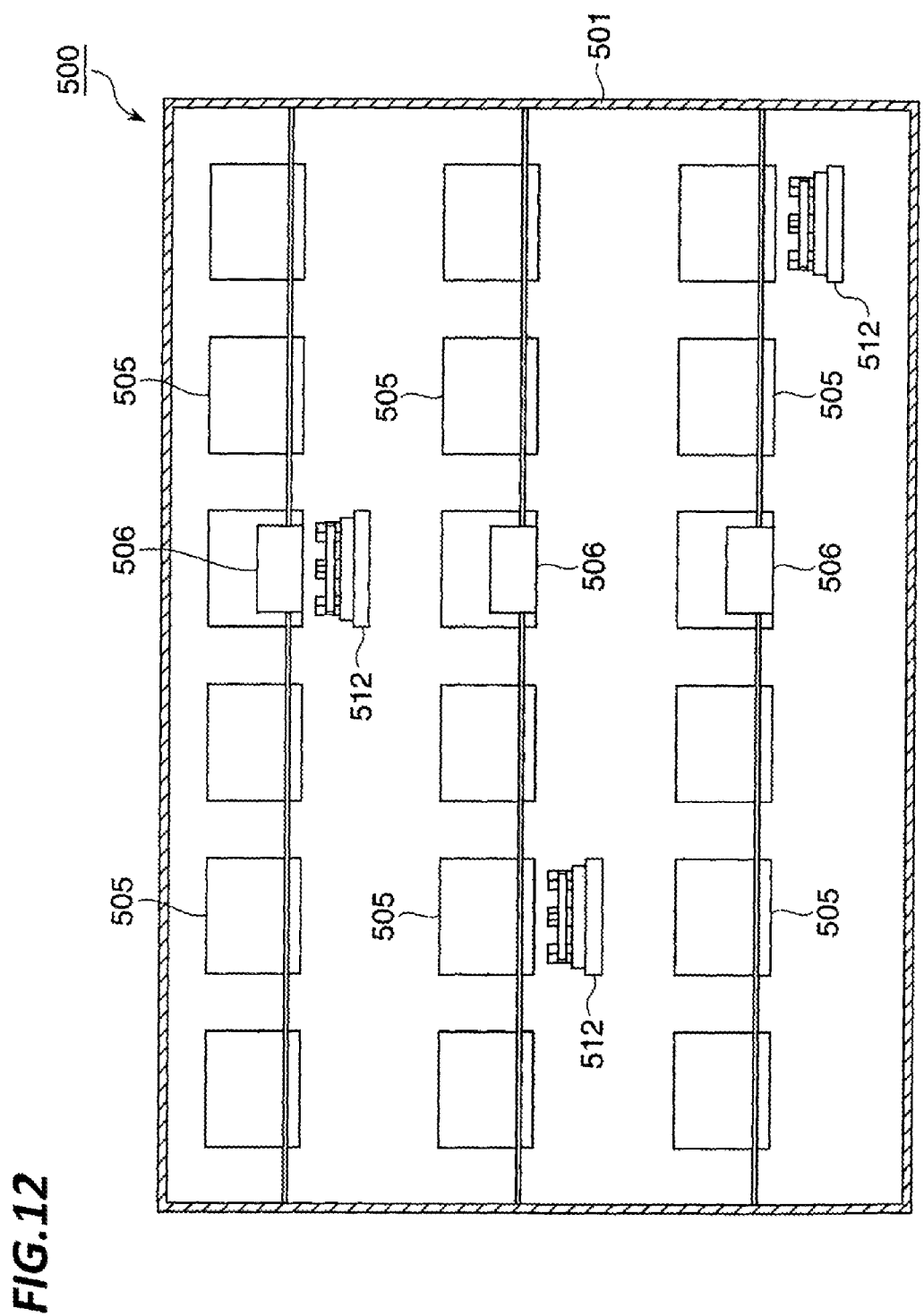
FIG. 12 is a view illustrating a cross-sectional schematic configuration taken along line B-B across the wafer inspection apparatus in FIG. 11.

Next, a configuration of the wafer inspection apparatus 500 will be described with reference to FIGS. 11 and 12. FIG. 11 illustrates a horizontal cross-sectional configuration of the wafer inspection apparatus 500, and FIG. 12 illustrates a cross-sectional configuration taken along line B-B of FIG. 11.

The wafer inspection apparatus 500 includes an inspection chamber 501. The inspection chamber 501 includes an inspection region 502 in which an electrical inspection of semiconductor devices formed on a semiconductor wafer is performed, an carry-in/carry-out region 503 in which the semiconductor wafer and the probe card 400 are carried into/carried out from the inspection chamber 501, and a transfer region 504 provided between the inspection region 502 and the carry-in/carry-out region 503.

In the inspection region 502, a plurality of testers 505 is disposed as an interface for inspection. Specifically, there is provided a three-layered structure of tester rows including the plurality of testers 505 that is horizontally arranged, and one tester side camera 506 is disposed for each of the tester rows. The tester side camera 506 is moved horizontally along the corresponding tester row, and positioned in front of each tester 505 that constitutes a tester row so as to check a position of, for example, the probe card 400 transferred by a transfer stage 512.

The carry-in/carry-out region 503 is partitioned into a plurality of accommodating spaces 507. Each of the accommodating spaces 507 is provided with, for example, a port 508 that accommodates, for example, a FOUP for accommodating a plurality of semiconductor wafers, an aligner 509 that performs alignment of the semiconductor wafer, a probe card accommodating unit 510 configured to a plurality of probe cards, in which the probe card 400 is carried into/carried out from the probe card accommodating unit 510, a controller 511 configured to control operations of respective constituent elements in the wafer inspection apparatus 500.

In the transfer region 504, a transfer stage 512 is disposed to be capable of moving not only to the transfer region 504, but also to the inspection region 502 and the carry-in/carry-out region 503. The transfer stage 512 receives a semiconductor wafer from the port 508 of the carry-in/carry-out region 503, transfers the semiconductor wafer to each of the testers 505, and transfers the semiconductor wafer from each of the testers 505 to the port 508 after the completion of electrical inspection of the semiconductor devices on the semiconductor. In addition, the transfer stage 512 transfers a probe card 400 requiring replacement to the probe card accommodating unit 510 from each of the testers 505, and transfers a probe card 400 to be mounted on each of the testers 505 from the probe card accommodating unit 510.

In the wafer inspection apparatus 500 having the aforementioned configurations, the probe card 400 to be used for each of the testers 505 is transferred from the probe card accommodating unit 510 to each of the testers 505 by the transfer stage 512, and mounted on each of the testers 505. In addition, a semiconductor wafer is transferred from the port 508 to each of the testers 505 by the transfer stage 512, and an electrical inspection is performed on the semiconductor devices formed on the semiconductor wafer. In each of the testers 505, the probes arranged on the probe card 400 come into contact with electrode pads of the semiconductor devices formed on the semiconductor wafer in batches to obtain an electrical conduction and to perform the electrical inspection.

In addition, the present invention is not limited to the exemplary embodiments, and of course, various modifications may be made.

The present application claims priority based on Japanese Patent Application No. 2012-256209 filed on Nov. 22, 2012, the contents of which are incorporated herein in its entirety by reference.

DESCRIPTIONS OF SYMBOLS

| | |
|---|---|
| 100: probe card case | 200: upper case |
| 201: top plate | 202: side wall |
| 203: handle | 204: handle screw |
| 205: through hole | 206: upper fixing mechanism |
| 300: lower case | 301: bottom plate |
| 302: side wall | 303: mounting portion |
| 304: lower fixing mechanism | 400: probe card |
| 401: substrate | 402: frame |
| 403: subset of electrical connecting portions | |
| 404: positioning portion | 405: protrusion |

What is claimed is:

1. A probe card case for accommodating a probe card, the probe card case comprising:
   a first case member configured to mount the probe card including an insulating substrate and a probe disposed on a bottom surface of the insulating substrate, the first case member facing the probe so as not to expose the probe;
   a second case member configured to be fitted to a top side of the first case member, the second case member including a card fixing mechanism for fixing the probe card to the second case member; and
   a case fixing mechanism configured to selectively fix the first case member to the second case member and separate the first case member from the second case member,
   wherein the probe card is capable of being selectively transferred in a state where the probe card is accommodated in the probe card case with the first case member fixed to the second case member, and in a state where the probe card is fixed to the second case member that is separated from the first case member.

2. The probe card case of claim 1, wherein the probe card is capable of being fixed to the second case member and capable of being released from the second case member, respectively due to an operation from a side opposite to a probe card side of the second case member.

3. The probe card case of claim 1, wherein at least a part of the second case member is transparent so that the probe card accommodated in the probe card case is visible from the outside.

4. The probe card case of claim 1, wherein a plurality of transfer handles is provided on the second case member.

5. The probe card case of claim 1, wherein fitting portions are disposed on a top surface of the second case member and a bottom surface of the first case member, respectively, the fitting portions being fitted to each other when a plurality of probe card cases is superimposed.

6. A method of transferring a probe card which includes an insulating substrate, a probe disposed on a bottom surface of the substrate, an electrical connecting portion disposed on a top surface of the substrate and connected to an electrical measuring device when electrically connected with the probe, and a frame configured to surround the substrate, the method comprising:
   causing the probe card to be accommodated in the probe card case according to claim 1; and
   transferring the probe card only with the second case member in a state where the probe card is fixed to the second case member.

* * * * *